United States Patent
Kersch

(10) Patent No.: US 6,716,748 B2
(45) Date of Patent: Apr. 6, 2004

(54) REACTION CHAMBER FOR PROCESSING A SUBSTRATE WAFER, AND METHOD FOR PROCESSING A SUBSTRATE USING THE CHAMBER

(75) Inventor: Alfred Kersch, Putzbrunn (DE)

(73) Assignee: Infineon Technologies AG, Munich (DE)

( * ) Notice: Subject to any disclaimer, the term of this patent is extended or adjusted under 35 U.S.C. 154(b) by 2 days.

(21) Appl. No.: 10/047,814

(22) Filed: Jan. 15, 2002

(65) Prior Publication Data

US 2002/0092840 A1 Jul. 18, 2002

(30) Foreign Application Priority Data

Jan. 15, 2001 (DE) .......................... 101 01 548

(51) Int. Cl.⁷ .......................... H01L 21/44; C23C 16/00
(52) U.S. Cl. .................. 438/660; 438/663; 118/715; 219/39; 392/416; 432/58
(58) Field of Search .................. 438/660, 663

(56) References Cited

U.S. PATENT DOCUMENTS

| | | | | |
|---|---|---|---|---|
| 4,365,588 A | * | 12/1982 | Jolly .......................... | 118/732 |
| 5,837,555 A | * | 11/1998 | Kaltenbrunner et al. .... | 438/796 |
| 5,861,609 A | * | 1/1999 | Kaltenbrunner et al. .... | 219/390 |
| 5,879,459 A | * | 3/1999 | Gadgil et al. ................ | 118/715 |
| 5,884,412 A | * | 3/1999 | Tietz et al. .................... | 34/58 |
| 5,970,214 A | * | 10/1999 | Gat .............................. | 392/416 |
| 6,198,074 B1 | * | 3/2001 | Savas .......................... | 219/390 |
| 6,375,750 B1 | * | 4/2002 | van Os et al. .............. | 118/728 |
| 6,403,475 B1 | * | 6/2002 | Tanabe et al. .............. | 438/663 |

FOREIGN PATENT DOCUMENTS

DE 197 47 164 A1 5/1999

\* cited by examiner

*Primary Examiner*—W. David Coleman
(74) *Attorney, Agent, or Firm*—Laurence A. Greenberg; Werner H. Stemer; Ralph E. Locher

(57) ABSTRACT

A reaction chamber for processing a substrate wafer is described. The reaction chamber has a wafer holder for receiving the substrate wafer, a convection plate, which is disposed above the wafer holder, for suppressing convective movements over the substrate wafer, and a gas distributor plate which is disposed on a side face of the reaction chamber, for distributing process or purge gases that flow in. A flow plate is disposed on the gas distributor plate and extends substantially in a plane that is perpendicular to the gas distributor plate. This allows rapid and efficient purging of the reaction chamber.

10 Claims, 2 Drawing Sheets

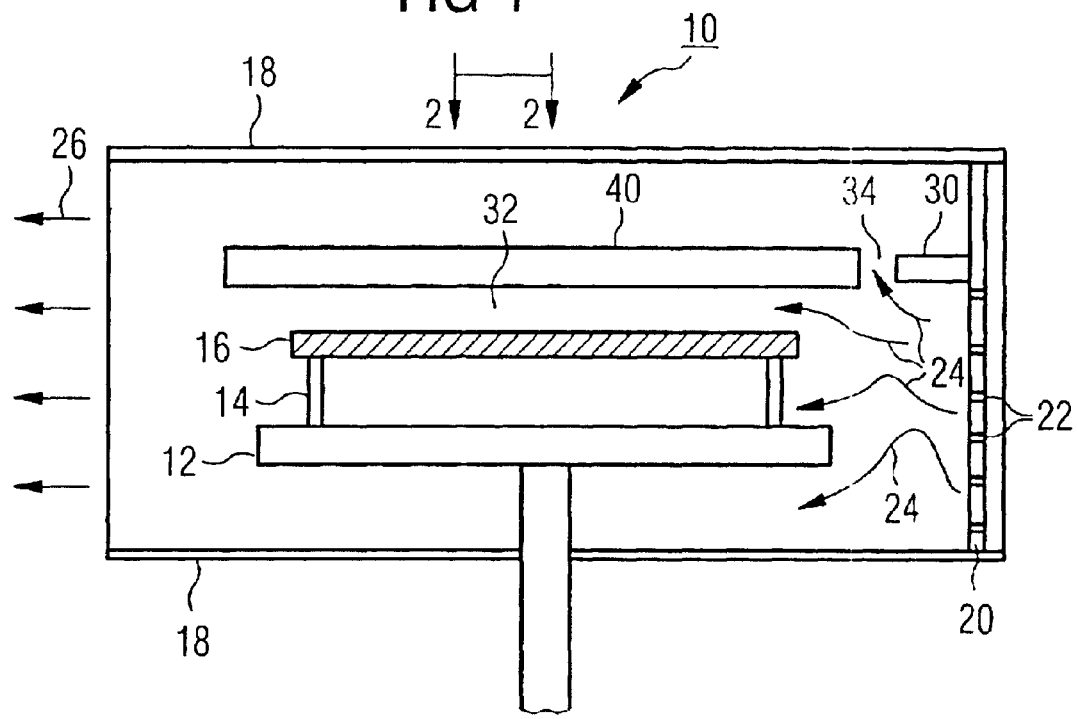
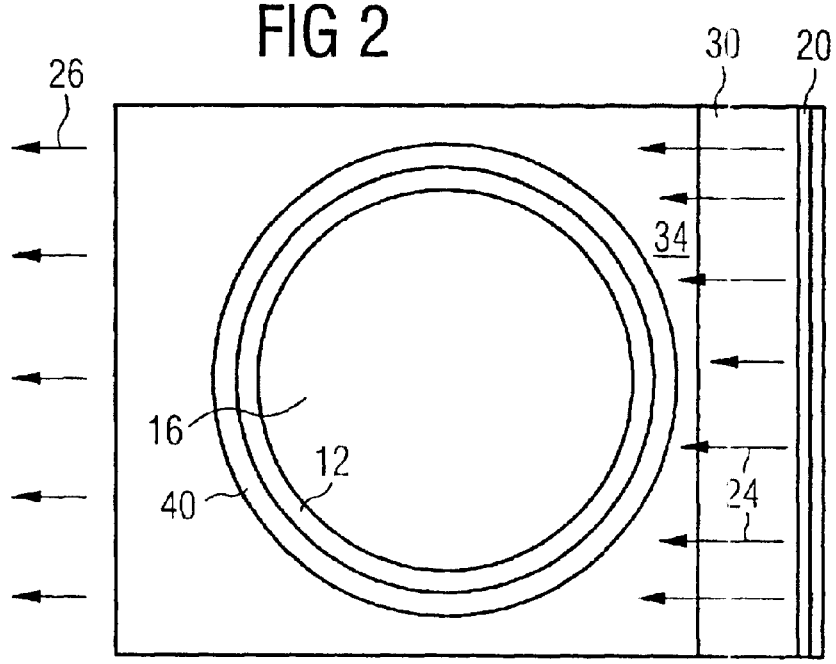

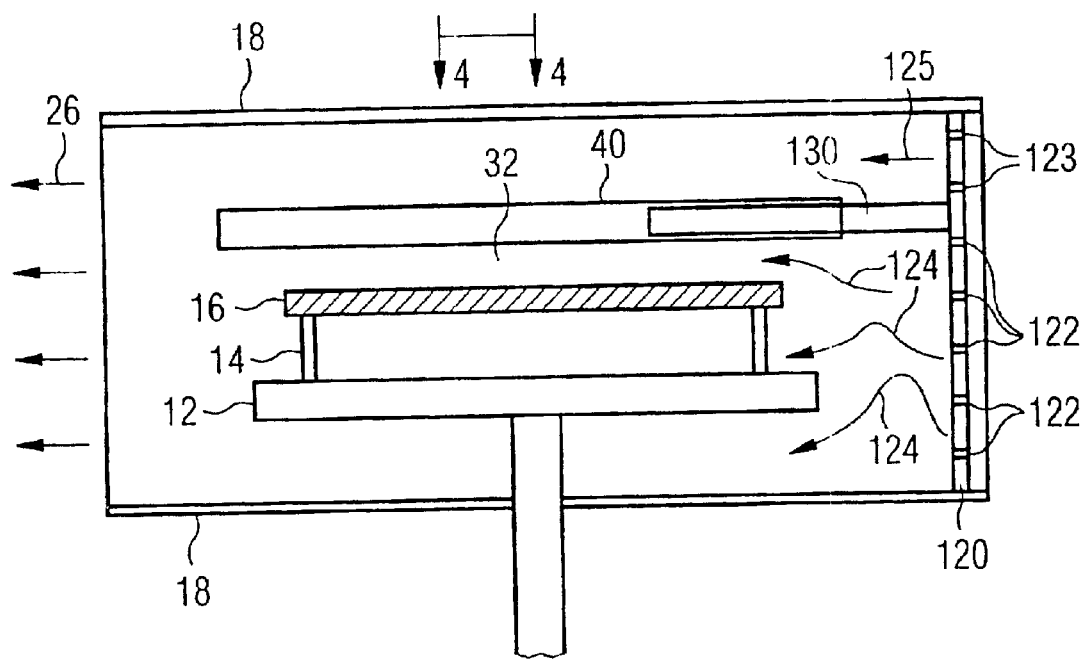
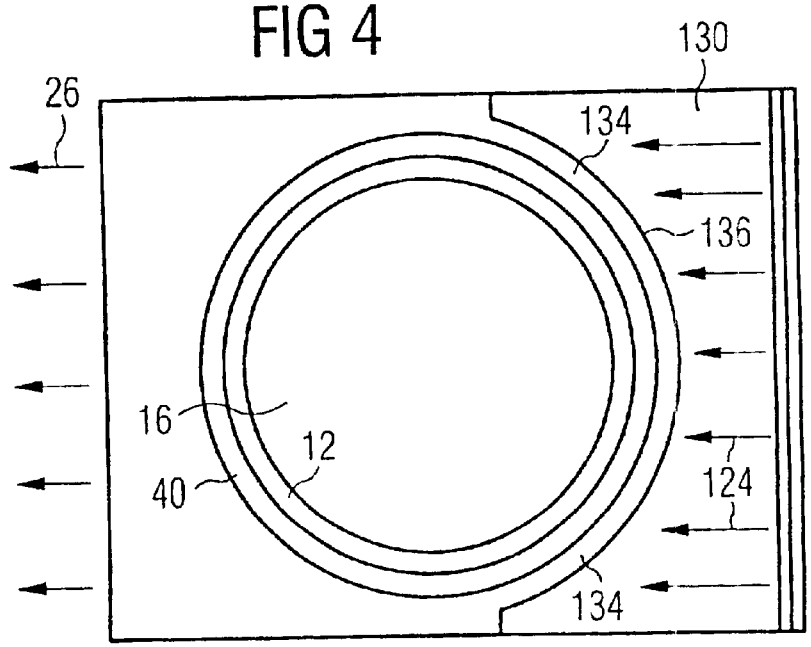

REACTION CHAMBER FOR PROCESSING A SUBSTRATE WAFER, AND METHOD FOR PROCESSING A SUBSTRATE USING THE CHAMBER

BACKGROUND OF THE INVENTION

Field of the Invention

The present invention relates to a reaction chamber for processing a substrate wafer. The chamber is formed of a wafer holder for receiving the substrate wafer, a convection plate, which is disposed above the wafer holder, for suppressing convective movements over the substrate wafer, and a gas distributor plate which is disposed on a side face of the reaction chamber, for distributing process or purge gases which flow in.

In the field of semiconductor fabrication, an increasingly large number of thermally activated processes, such as for example annealing, thermal oxidation or chemical vapor deposition (CVD), are being carried out in single-wafer installations. One reason for this is that the reduced throughput compared to batch operation can be compensated or even overcompensated for at a higher temperature as a result of a shorter process time. This trend is being reinforced considerably by the transition to larger wafer diameters, for example from 200 mm to 300 mm. A further reason is that in single-wafer processes there are often exclusive process conditions that can no longer be achieved by stacked processing.

A fundamental problem of such processes is that of achieving a uniform temperature over the substrate wafer which is to be processed, in particular when using wafers with large diameters of 200–300 mm, as are becoming increasingly widespread in semiconductor fabrication. This problem has been linked to convective movements that are caused by different temperatures on the substrate wafer and at the walls of the reaction chamber. To suppress the convective movements, it is proposed, in Published, Non-Prosecuted German Patent Application DE 197 47 164 A, for a convection plate to be disposed above the substrate wafer, which plate, in the case of a rotatable wafer holder, can rotate together with the holder. To be able to effectively suppress the convective movements, the distance between the convection plate and the wafer holder must not be selected to be excessively great. The distance is preferably between 5 and 10 mm. Within this range, convective movements are effectively eliminated without there being any interaction between the substrate wafer and the convection plate.

To achieve better process uniformity, the substrate wafer that is to be processed is mounted on a disk-like support plate that is rotated at a rotational speed of typically 10–100 rpm (revolutions per minute). The substrate wafer together with the carrier plate is generally rotating throughout the entire duration of the process cycle. The rotation is only stopped for loading and unloading of the substrate wafer.

In order for process and purge gases to be supplied, reaction chambers of this type often have a gas inlet in the form of a gas distributor plate that distributes the gas as uniformly as possible over an entire side face of the chamber. This is usually achieved by a configuration of openings that are distributed uniformly over the gas distributor plate. After a processing step has ended, the process gas is extracted via a gas outlet disposed on the opposite side of the reaction chamber, and, if necessary, the chamber is purged using a purge gas.

By way of example, in the case of a single-wafer rapid thermal processing (RTP) reactor, which is used, inter alia, for rapid thermal oxidation (RTO), the reaction chamber is purged with nitrogen after the oxidation operation. It is an essential condition for a high yield during the following steps of the process cycle that the oxygen be removed as completely as possible. Since the throughout of an installation of this type is partially determined, to a considerable extent, by the purge time, it is essential to minimize the purge time until an acceptable oxygen concentration is reached.

In the reaction chamber described above, after the introduction of the convection plate in order to achieve a greater temperature uniformity over the substrate wafer, the problem has arisen that the purge time has had to be made much longer in order for the oxygen to be removed from the chamber. Since increasing the purge flow rate to approximately 100 slm (Standard Liters per Minute) did not lead to sufficient removal of the oxygen, it was necessary to increase the purge time from what was previously a few seconds to one minute. However, such a long purge time already represents a considerable proportion of the overall process time and is therefore not economically acceptable.

SUMMARY OF THE INVENTION

It is accordingly an object of the invention to provide a reaction chamber for processing a substrate wafer and a method for operating the chamber which overcome the above-mentioned disadvantages of the prior art devices and methods of this general type, in which, following a treatment step, a thorough purge step can be carried out quickly. Furthermore, it is intended to provide a method for operating a reaction chamber of this type.

With the foregoing and other objects in view there is provided, in accordance with the invention, a reaction chamber for processing a substrate wafer. The reaction chamber contains a wafer holder for receiving the substrate wafer to be processed, and a convection plate disposed above the wafer holder. The convection plate suppresses convective movements over the substrate wafer. A gas distributor plate is disposed on a side face of the reaction chamber. The gas distributor distributes process and purge gases which flow in. A flow plate is disposed on the gas distributor plate and extends substantially in a plane perpendicular to the gas distributor plate.

According to the invention, a reaction chamber of the generic type has the flow plate disposed on the gas distributor plate and extends substantially in a plane that is perpendicular to the gas distributor plate.

It has been discovered by the present inventor that the insufficient gas purging in reaction chambers of the generic type relates primarily to the area between the substrate wafer and the convection plate and results from a rolling circulatory movement upstream of the gas distributor plate. With the geometry of the conventional reaction chamber, the gas flow then tends, on account of the lower flow resistance at the sides of the wafer holder/substrate wafer/convection plate stack, to run from the gas inlet to the gas inlet. The result is a recirculating movement between the plates, which leads to closed flow lines and therefore to areas in which gases are trapped for a relatively long time.

Furthermore, it has emerged that the effect is further intensified by the rotary movement of the plates, which generally also takes place during the purging operation. In addition, the distance between the wafer holder and the convection plate has to be kept relatively short, in order to be able to suppress the convective movements over the substrate wafer. The result is a relatively high flow resistance for the flow between the substrate wafer and the convection plate, which makes the above-mentioned problems even worse.

The above-mentioned circulating movement is suppressed by the flow plate that is now additionally provided, and the gas flow is increasingly guided into the area between the substrate wafer and the convection plate. The changed flow conditions in the reaction chamber lead to the purge gas passing more successfully into the particularly critical area between the substrate wafer and the convection plate, making the required purge time considerably shorter.

The flow plate is preferably disposed approximately at the level of the convection plate on the gas distributor plate, so that the flow plate extends from the gas distributor plate to the convection plate and leaves only a relatively small intervening space for gas flowing through. As a result, the gas flow is guided particularly effectively into the space between the substrate wafer and the convection plate. Furthermore, the flow plate can extend right up to the convection plate.

In a preferred embodiment, the intervening space between the flow plate and the convection plate is large enough for sufficient purge gas to pass through the intervening space into the area above the convection plate, in order for a sufficient purging action to be achieved there as well.

In a further preferred embodiment, the profile of the chamber-internal edge of the flow plate is matched to the shape of the convection plate, in such a manner that a uniform distance between the convection plate and the flow plate is achieved over a wide area. For example, if the convection plate is circular, the flow plate may be in the shape of a rectangle with a cutout that is in the shape of a segment of a circle. As a result of this measure, it is obvious that a particularly large portion of the gas flow is guided into the area between the substrate wafer and the convection plate, although as the distance between the flow plate and the convection plate decreases, the flow of purge gas into the area above the convection plate also decreases. Therefore, the shape and size of the flow plate are expediently adapted to the geometry of the reaction chamber in such a way that sufficient purge gas passes into the area between the substrate wafer and the convection plate and into the area above the convection plate.

The gas distributor plate expediently has a plurality of gas outlet openings that are distributed over the plate surfaces. In a preferred embodiment, the gas outlet openings are disposed exclusively in the area below the flow plate, so that process and purge gases flow into the reaction chamber only below the flow plate. This may be advantageous in particular if the distance between the flow plate and the convection plate is so great that sufficient purge gas passes into the space above the convection plate from below. However, if this intervening space is small, it is generally more advantageous for gas outlet openings also to be provided in the gas distributor plate above the flow plate.

Since the substrate wafer is generally heated with a lamp array from the top side and/or the underside, it is advantageous for the gas distributor plate and/or the flow plate to be formed from quartz glass. Furthermore, it may be expedient for the gas distributor plate and the flow plate to be produced integrally.

In operation, the substrate wafer is processed in the reaction chamber as a result of the substrate wafer being introduced into the chamber, a process gas, such as, for example, oxygen, being fed to the chamber, a processing step, for example a RTO, being carried out on the substrate wafer, and then the chamber being purged as a result of a purge gas, such as, for example, nitrogen, being fed via the gas distributor plate.

To increase process uniformity, it is preferable for the wafer holder is rotated while the processing step is being carried out. For the step of purging the chamber, it has proven advantageous if the rotation of the substrate wafer is switched off while the chamber is being purged.

Although the following text relates predominantly to the use of the reaction chamber in conjunction with semiconductor fabrication, the described reaction chamber for processing the substrate wafer and the method for its operation can also be used for the deposition of thin films on substrates made from glass or plastic.

Other features which are considered as characteristic for the invention are set forth in the appended claims.

Although the invention is illustrated and described herein as embodied in a reaction chamber for processing a substrate wafer, and a method for operating the chamber, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic section view through an embodiment of a reactor according to the invention;

FIG. 2 is a plan view of the reactor shown in FIG. 1;

FIG. 3 is a diagrammatic sectional view of a further embodiment of the reactor; and FIG. 4 is a plan view of the embodiment illustrated in FIG. 3.

DESCRIPTION OF THE PREFERRED EMBODIMENTS

Referring now to the figures of the drawing in detail and first, particularly, to FIG. 1 thereof, there is shown a single-wafer rapid thermal processing (RTP) reaction chamber 10 which is used, inter alia, for a rapid thermal oxidation (RTO) process. A wafer 16 has been laid onto a rotary plate 12 via pins 14. The wafer 16 is heated from the top-side and from the underside by an array of non-illustrated lamps, which are separated from the interior of the reaction chamber 10 by quartz plates 18. To suppress convective movements on the wafer 16 caused by the heating, a convection plate 40 is disposed above the wafer 16, at a distance of a few millimeters therefrom.

The process and purge gases flow in through a gas inlet that is formed on one side of the chamber by a gas distributor plate 20. The gas distributor plate 20 has a large number of openings 22 that are distributed at regular intervals over the surface of the distributor plate 20. At the level of the convection plate 40, a rectangular flow plate 30, which extends in a plane perpendicular to the gas distributor plate 20, toward the convection plate 40, is disposed on the gas distributor plate 20 at the level of the convection plate 40. A sufficiently large intervening space 34 is left between the flow plate 30 and the convection plate 40, so that there are no openings in the gas distributor plate 20 above the flow plate 30.

In operation, the interior of the reaction chamber 10 is purged with nitrogen after the oxidation has been carried out. The direction of flow of the nitrogen gas flowing in is diagrammatically indicated by reference numeral 24 in FIG. 1. On account of its shape and configuration, the flow plate 30 ensures that a sufficient quantity of purge gas is guided into an area 32 between the wafer 16 and the convection plate 40. The purge gas and the extracted process gas leave the chamber via a gas outlet 26.

The improved purging in particular in the area between the wafer 16 and the convection plate 40 was also confirmed in three-dimensional transient simulations of the purging operation. In the simulations, the geometry of the reaction chamber 10 was reproduced in a model and the flow processes were digitally simulated. The spatial distribution of the process and purge gas as a function of the purge time is obtained as the result of the simulations.

FIGS. 3 and 4 show a further embodiment, in which a flow plate 130 takes up a considerably larger area. To keep a space 134 between the convection plate 40 and the flow plate 130 small and uniform, the flow plate 130 is matched, in terms of its shape, to the disk-shaped convection plate 40 and is in the shape of a rectangle with a cutout that is in the shape of a segment of a circle. The result is a uniform short distance between an chamber-internal edge 136 of the flow plate 130 and the convection plate 40, so that a large proportion of the purge gas flowing in is guided into the area 32 between the substrate wafer 16 and the convection plate 40.

In this embodiment, the proportion of a gas flow 124 that passes into the area above the convection plate 40 from below via the intervening space 134 is low. In a gas distributor plate 120, as well as openings 122 there are also openings 123 above the flow plate 130, the openings 123 ensuring sufficient purging of the area lying above the convection plate 40.

Overall, the introduction of the flow plate 30 or 130 has led to a considerable reduction in the required purge time, for example from one minute to less than 20 seconds.

A further improvement in the purging performance has been achieved by the fact that the rotation of the wafer holder, which usually takes place through the entire process cycle, was switched off during the purging operation. By way of example, the rotation was reduced linearly from 60 rpm to 0 rpm within the first six seconds of the purging operation.

This resulted in particularly favorable purging results and short purge times.

I claim:

1. A reaction chamber for processing a substrate wafer, comprising:
   a wafer holder for receiving the substrate wafer to be processed;
   a convection plate disposed above said wafer holder, said convection plate suppressing convective movements over the substrate wafer;
   a gas distributor plate disposed on a side face of the reaction chamber, said gas distributor plate distributing process and purge gases which flow in, said gas distributor plate having a surface and a plurality of gas outlet openings formed therein distributed over said surface; and
   a flow plate disposed on said gas distributor plate and extending substantially in a plane perpendicular to said gas distributor plate.

2. The reaction chamber according to claim 1, wherein said flow plate is disposed approximately at a level of said convection plate on said gas distributor plate.

3. The reaction chamber according to claim 2, wherein said flow plate extends right up to said convection plate.

4. The reaction chamber according to claim 1, wherein said flow plate has a chamber-internal edge with a profile matched to a shape of said convection plate, in order to achieve a uniform distance between said convection plate and said flow plate.

5. The reaction chamber according to claim 1, wherein said gas distributor plate has said gas outlet openings disposed only below a level of said flow plate.

6. A reaction chamber for processing a substrate wafer, comprising:
   a wafer holder for receiving the substrate wafer to be processed;
   a convection plate disposed above said wafer holder, said convection plate suppressing convective movements over the substrate wafer;
   a gas distributor plate disposed on a side face of the reaction chamber, said gas distributor plate distributing process and purge gases which flow in; and
   a flow plate disposed on said gas distributor plate and extending substantially in a plane perpendicular to said gas distributor plate;
   at least one of said gas distributor plate and said flow plate being formed of quartz.

7. A reaction chamber for processing a substrate wafer, comprising:
   a wafer holder for receiving the substrate wafer to be processed;
   a convection plate disposed above said wafer holder, said convection plate suppressing convective movements over the substrate wafer;
   a gas distributor plate disposed on a side face of the reaction chamber, said gas distributor plate distributing process and purge gases which flow in; and
   a flow plate disposed on said gas distributor plate and extending substantially in a plane perpendicular to said gas distributor plate;
   said gas distributor plate and said flow plate being produced integrally.

8. A method for processing a substrate wafer, which comprises the steps of:
   introducing the substrate wafer into a reaction chamber with a wafer holder, a convection plate disposed above the wafer holder, a gas distributor plate disposed on a side face of the reaction chamber and having a surface and a plurality of gas outlet openings formed therein distributed over the surface, and a flow plate disposed on the gas distributor plate and extending substantially in a plane perpendicular to the gas distributor plate;
   placing the substrate wafer on the wafer holder;
   feeding a process gas into the reaction chamber through the gas distributor plate;
   carrying out a processing step on the substrate wafer; and
   purging the reaction chamber by feeding a purge gas through the gas distributor plate.

9. The method according to claim 8, which comprises rotating the wafer holder while the processing step is being carried out on the substrate wafer, and a rotation of the substrate wafer is switched off while the reaction chamber is being purged.

10. The reaction chamber according to claim 1, wherein said gas distributor plate has said gas outlet openings disposed below a level of said flow plate and above a level of said flow plate.

* * * * *